United States Patent
Oohata et al.

(10) Patent No.: US 6,773,943 B2
(45) Date of Patent: Aug. 10, 2004

(54) DISPLAY UNIT AND METHOD OF FABRICATING THE SAME

(75) Inventors: Toyoharu Oohata, Kanagawa (JP);
Hideharu Nakajima, Kanagawa (JP);
Yoshiyuki Yanagisawa, Kanagawa (JP);
Toshiaki Iwafuchi, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/275,840

(22) PCT Filed: Feb. 20, 2002

(86) PCT No.: PCT/JP02/01469
§ 371 (c)(1),
(2), (4) Date: Mar. 12, 2003

(87) PCT Pub. No.: WO02/073706
PCT Pub. Date: Sep. 19, 2002

(65) Prior Publication Data
US 2003/0157741 A1 Aug. 21, 2003

(30) Foreign Application Priority Data
Mar. 9, 2001 (JP) .......................... 2001-67238

(51) Int. Cl.[7] .............................................. H01L 21/00
(52) U.S. Cl. ...................... 438/30; 438/23; 438/127; 257/13; 257/80; 257/81; 257/82; 257/93; 345/82; 345/183
(58) Field of Search .................... 438/30, 23, 127; 257/13, 80–82; 345/82, 183

(56) References Cited

U.S. PATENT DOCUMENTS

| | | | | |
|---|---|---|---|---|
| 3,789,471 A | * | 2/1974 | Spindt et al. ................ | 445/52 |
| 5,177,405 A | * | 1/1993 | Kusuda et al. | |
| 5,283,437 A | * | 2/1994 | Greschner et al. .......... | 250/306 |
| 5,325,277 A | * | 6/1994 | Suzuki et al. ................ | 362/84 |
| 5,338,690 A | * | 8/1994 | Fukaya et al. ............... | 438/59 |

(List continued on next page.)

FOREIGN PATENT DOCUMENTS

| | | | |
|---|---|---|---|
| EP | 0550-354 A1 | * 12/1992 | .......... H04N/1/036 |
| JP | 56-92577 | * 7/1981 | |
| JP | 57-45583 | * 3/1982 | |

(List continued on next page.)

OTHER PUBLICATIONS

Marcus et al. "Atomically sharp silicon and metal field emitters" IEEE trans. on Elect. devices vol. 38 No. 10 10/91 p. 2289–2293.*

Ghis et al. "Sealed vacum devices: fluorescent microtip displays" IEEE trans. on Elect. devices vol. No 10/91 p. 2320–2322.*

Primary Examiner—Matthew S. Smith
Assistant Examiner—Granvill D. Lee, Jr.
(74) Attorney, Agent, or Firm—Bell, Boyd & Lloyd LLC

(57) ABSTRACT

A display unit having a sufficient luminance and a method of fabricating the display unit are provided. The display unit includes micro-sized semiconductor light emitting devices fixedly arrayed on a plane of a base body of the display unit at intervals. Micro-sized GaN based semiconductor light emitting devices formed by selective growth are each buried in a first insulating layer made from an epoxy resin except an upper end portion and a lower end surface thereof, and electrodes of each of the light emitting devices are extracted. These light emitting devices are fixedly arrayed on the upper plane of the base body at intervals. A second insulating layer made from an epoxy resin is formed on the plane of the base body so as to cover the semiconductor light emitting devices each of which has been buried in the first insulating layer. The electrodes are extracted to the upper surface of the second insulating layer via specific connection holes formed in the second insulating layer, and the electrode is led to a connection electrode provided on the base body via a connection hole formed in the second insulating layer.

19 Claims, 7 Drawing Sheets

U.S. PATENT DOCUMENTS

| | | | |
|---|---|---|---|
| 5,578,900 A | * 11/1996 | Peng et al. | 313/495 |
| 5,627,088 A | * 5/1997 | Fukaya et al. | 438/155 |
| 5,656,525 A | * 8/1997 | Lin et al. | 216/11 |
| 5,751,683 A | * 5/1998 | Kley | 369/126 |
| 5,932,327 A | * 8/1999 | Inoguchi et al. | 428/212 |
| 5,981,977 A | * 11/1999 | Furukawa et al. | |
| 6,306,734 B1 | * 10/2001 | Givargizov | 438/478 |
| 6,329,214 B1 | * 12/2001 | Hattori et al. | 438/20 |
| 6,649,431 B2 | * 11/2003 | Merkulov et al. | 438/20 |

FOREIGN PATENT DOCUMENTS

| | | | | |
|---|---|---|---|---|
| JP | 57-52071 | * | 3/1982 | |
| JP | 57-52072 | * | 3/1982 | |
| JP | 57-52073 | * | 3/1982 | |
| JP | 58-50577 | * | 3/1983 | |
| JP | 61-156780 | * | 7/1986 | |
| JP | 2-263668 | * | 10/1990 | |
| JP | 03-035568 | * | 2/1991 | |
| JP | 05-090696 | * | 9/1993 | H01S/3/18 |
| JP | 6-45648 | * | 2/1994 | |
| JP | 06-067044 | * | 3/1994 | |
| JP | 07-199829 | * | 4/1995 | |
| JP | 9-129974 | * | 5/1997 | |
| JP | 11-26883 | * | 1/1999 | |
| JP | 11-075019 | * | 3/1999 | |
| JP | 11-177138 | * | 7/1999 | |
| JP | 11-514136 | * | 11/1999 | |
| JP | 11-346004 | * | 12/1999 | |
| WO | WO97/44612 | * | 11/1997 | |

* cited by examiner

DISPLAY UNIT AND METHOD OF FABRICATING THE SAME

RELATED APPLICATION DATA

The present application claims priority to Japanese Patent Application No. P2001-067238 filed on Mar. 9, 2001, herein incorporated by reference.

BACKGROUND OF THE INVENTION

The present invention relates to a display unit and a method of fabricating the display unit. More specifically, the present invention relates to a display unit including a plurality of micro-sized semiconductor light emitting devices arrayed on a plane of a base body at intervals and a method of fabricating the display unit.

Display units of a type using light emitting diodes (LEDs) as a light emitting source, as shown in FIG. 10, are known. FIG. 10 is a perspective view showing a rear side of an essential portion of one example of such related art display units. Referring to this figure, a display unit 100 is fabricated by two-dimensionally, densely arraying expensive LED modules 102, the size of each of which is standardized into a relatively large value (for example, 5 mm square), on a plane 101 of a base body and fixing them thereon, and connecting an anode electrode 103 and a cathode electrode 104 of each of the LED modules 102 to wiring provided on the base body by wire bonding or soldering. This related art display unit 100 has the following problem. An LED chip having a size being usually about 0.3 mm square cut out of a compound semiconductor wafer is used for the LED module 102 per one pixel, and therefore, a large number of the compound semiconductor wafers are required to provide the LED chips used for several hundreds of thousands of pixels constituting the full-screen of the display unit 100, with a result that the material cost is raised. Another problem of the related art display unit 100 is that since additional equipment and working steps are required for arraying and fixture of the LED modules and connection of the electrodes to wiring by wire bonding or soldering, the fabrication cost is essentially raised.

Each of the LED chips used for the related art display unit 100 has been usually of a planar type typically shown in FIG. 11, wherein a p-type semiconductor 106 having a p-electrode 107 and an n-type semiconductor 108 having an n-electrode 109 are stacked in a plane structure with an active layer 105 sandwiched therebetween. Light emitted from the active layer 105 is basically directed in omni-directions; however, due to a relationship between a relatively large refractive index of the semiconductor and an incident angle from the interior of the semiconductor to the interface (surface), light directed in the vertical direction is mainly emerged to the outside through the interface. As a result, there occur problems that the light emission efficiency in the downward direction is low even in consideration of the fact that the light directed upwardly (rear surface side) is reflected from an electrode plane or the like to the lower side (front surface side), and that the light emitted to the rear surface side is made incident on the adjacent LED module to cause bleeding in an image displayed on the display unit.

As one specific related art example, a display unit capable of reducing the cost and improving the reliability by using light emitting diodes buried in an insulating material has been disclosed in Japanese Patent Laid-open No. Sho 57-45583. The light emitting diode used in this display unit, however, is a light emitting diode chip having a planar structure cut out of a wafer, and an anode electrode and a cathode electrode have been mounted on each of the chips in the wafer state. Also, an epoxy resin used as an insulating layer to bury spaces among the light emitting diodes fixedly arrayed on a substrate is poured and cured such that the upper surface of the insulating layer is substantially at the same level as the upper end surfaces of the light emitting devices, and the upper surface of the insulating layer is smoothened by lapping or the like.

Japanese Patent Laid-open No. Hei 3-35568 has disclosed a light emitting diode having a small pn-junction region, wherein an upper end side of a semiconductor portion taken as an optical path over the pn-junction is cut into a truncated pyramid shape in order to significantly improve the rate of light emerged outwardly from the inside of the light emitting diode through the interface between the light emitting diode and an outer transparent plastic. The refractive index of the light emitting diode is greatly different from that of the transparent plastic around the light emitting diode. Accordingly, of light directed from a point light source to the interface, a light component entering the interface in the direction perpendicular to the interface, that is, at an incident angle of 0° and a light component having an incident angle smaller than a conical angle (for example, 27°) centered at the point light source pass through the interface; however, other light components each having a large incident angle are reflected from the interface and thereby impossible to be emerged outwardly from the inside of the light emitting diode, and are repeatedly reflected from the interface to be decayed. The cutting the upper end side of the semiconductor portion into the truncated pyramid shape is made to avoid such a phenomenon as much as possible.

Japanese Patent Laid-open No. Hei 11-75019 has disclosed a light source unit using light emitting diodes, wherein a tilt mirror tilted at 45° is provided at a position over a semiconductor chip as the light emitting diode. The mirror is provided for allowing light emitted upwardly from the light emitting diode to be reflected from the mirror at right angles, that is, toward the horizontal direction, and as such a mirror, there is used a dichroic mirror for reflecting light emitted from the light emitting diodes for emission of light of blue, green, and red onto the same optical axis.

SUMMARY OF THE INVENTION

The present invention provides a display unit fabricated at a low cost by arraying micro-sized semiconductor light emitting devices at intervals and simply fixing them thereon, and a method of fabricating the display unit. The present invention provides a display unit that includes semiconductor light emitting devices each of which is of a micro-size and has a sufficient luminance, and a method of fabricating the display unit.

According to an embodiment of the invention, there is provided a display unit including a plurality of semiconductor light emitting devices mounted in array on a plane of a base body. The semiconductor light emitting devices are fixedly arrayed on the plane of the base body at intervals in a state being buried in a first insulating layer or in a bare state being not buried in the first insulating layer; a second insulating layer is formed on the plane of the base body so as to cover the semiconductor light emitting devices; and an upper end side electrode and a lower end side of each of the semiconductor light emitting devices are extracted via connection holes formed in specific positions of the first insulating layer and the second insulating layer.

With this display unit, since the semiconductor light emitting devices are fixedly arrayed on the plane of the base body at intervals in a state being buried in the first insulating layer or in a bare state being not buried in the first insulating layer, and the electrodes of each of the semiconductor light emitting devices are extracted via the connection holes formed in the second insulating layer covering the semiconductor light emitting devices, it is possible to significantly reduce the cost per unit area of the display unit.

According to an embodiment of the invention, there is provided a display unit, wherein the semiconductor light emitting devices are fixedly arrayed on the plane of the base body in a state being buried in the first insulating layer except the upper end portions and the lower end portions of the semiconductor light emitting devices; the upper end side electrode and the lower end side electrode of each of the semiconductor light emitting devices are extracted to the upper surface of the first insulating layer and then extracted to the upper surface of the second insulating layer; and either of the electrodes is led to a connection electrode provided on the plane of the base body. With this display unit, since each of the semiconductor light emitting devices is buried in the first insulating layer to form a resin-covered chip having a large size, it is possible to facilitate the handling of the semiconductor light emitting device, and since one electrode is connected to a drive circuit on the upper surface of the second insulating layer and the other electrode is connected to a drive circuit on the plane of the base body, the drive circuits for the electrodes located in the directions perpendicular to each other do not cross each other, so that it is possible to simplify the wiring.

According to an embodiment of the invention, there is provided a display unit, wherein the semiconductor light emitting devices are fixedly arrayed on the plane of the base body in the state being bared; the second insulating layer is formed on the plane of the base body so as to cover the semiconductor light emitting devices; the upper end side electrode and the lower end side electrode of each of the semiconductor light emitting devices are extracted to the upper surface of the second insulating layer; and either of the electrodes is led to a connection electrode provided on the plane of the base body. With this display unit, since the first insulating layer in which the semiconductor light emitting devices are to be buried is not provided, some ingenuity is required in handling the semiconductor light emitting devices; however, it is possible to omit the device burying step, and since one electrode is connected to a drive circuit on the upper surface of the second insulating layer and the other electrode is connected to a drive circuit on the plane of the base body, the drive circuits for the electrodes located in the directions perpendicular to each other do not cross each other, thereby simplifying the wiring.

According to an embodiment of the invention, there is provided a display unit, wherein each of the first insulating layer and the second insulating layer is made from a polymer compound formable into a coating film, the polymer compound includes a polyimide resin, an ultraviolet curing resin, an epoxy resin, a synthetic rubber and/or the like. With this display unit, it is possible to easily form the insulating layer even on the plane, having a large area, of the base body by coating, and hence to simplify the mounting of the semiconductor light emitting devices on the plane of the base body.

According to an embodiment of the invention, there is provided a display unit, wherein each of the semiconductor light emitting devices mainly emits light in a direction from a light emission region to the lower end plane, mounted on the plane of the base body, of the semiconductor light emitting device; and the semiconductor light emitting device has, at a position over the light emission region, a reflection mirror from which the light is reflected downwardly. With this display unit, it is possible to effectively direct light from the light emission region to the lower end plane of the semiconductor light emitting device by means of the reflection mirror.

According to an embodiment of the invention, there is provided a display unit, wherein the semiconductor light emitting device is formed into a pyramid shape or a truncated pyramid shape; and any one of at least tilt planes among planes of the pyramid or truncated pyramid shaped semiconductor light emitting device is taken as the reflection mirror. With this display unit, since the tilt planes of the polygonal pyramid or the truncated polygonal pyramid can be taken as reflecting planes, or the upper plane of the truncated polygonal pyramid can be taken as a reflection mirror, it is possible to concentrate light emitted from the light emission region to the lower end plane of the semiconductor light emitting device.

According to an embodiment of the invention, there is provided a display unit, wherein the semiconductor light emitting device is made from a gallium nitride based semiconductor having a hexagonal system; and the semiconductor light emitting device includes an active layer formed in parallel to a (1-101) plane. With this display unit, since a light emission efficiency of the active layer formed in parallel to the (1-101) plane of the gallium nitride based semiconductor is high and an electrode plane provided on the (1-101) plane can be taken as a reflection mirror, it is possible to enhance the light emission characteristic.

According to an embodiment of the invention, there is provided a display unit, wherein the semiconductor light emitting device is made from a gallium nitride based semiconductor formed by crystal growth on a growth substrate into a hexagonal pyramid shape or a truncated hexagonal pyramid shape with a (0001) plane taken as the lower end plane and (1-101) planes and planes equivalent thereto taken as the tilt planes; and the semiconductor light emitting device includes an active layer formed in parallel to the (1-101) planes and planes equivalent thereto. With this display unit, since the light emission efficiency of the active layer formed in parallel to the (1-101) plane of the gallium nitride based semiconductor is high and an electrode plane provided on the (1-101) plane can be taken as a reflection mirror, it is possible to concentrate light emitted from the light emission region to the lower end plane of the semiconductor light emitting device and particularly enhance the light emission characteristic.

According to an embodiment of the invention, there is provided a display unit, wherein the display is an image display unit or a lighting unit including an array of only one kind of the semiconductor light emitting devices allowing emission of light of a single color, or an array of a combination of a plurality of kinds of the semiconductor light emitting devices allowing emission of light of different colors. Such a display unit can usable as an image display unit or a lighting unit having a high luminance, which includes light emitting diodes or semiconductor lasers.

According to an embodiment of the invention, there is provided a method of fabricating a display unit including a plurality of semiconductor light emitting devices on a plane of a base body. The method includes the steps of burying the semiconductor light emitting devices in a first insulating layer, forming specific connection holes in the first insulating layer, and extracting an upper end side electrode and a lower end side electrode of each of the semiconductor light emitting devices via the connection holes formed in the first insulating layer; fixedly arraying semiconductor light emitting devices, from each of which the electrodes have been extracted, on the plane of the base body at intervals; forming a second insulating layer so as to cover the semiconductor light emitting devices each of which has been buried in the first insulating layer; and forming specific connection holes in the second insulating layer, and extracting the upper end side electrode and the lower end side electrode of each of the semiconductor light emitting devices having been extracted to the upper surface of the first insulating layer via the connection holes. With this method of fabricating a display unit, since each of the semiconductor light emitting devices is buried in the first insulating layer to form a resin-covered chip having a large size, it is possible to facilitate the handling of the light emitting devices and hence to easily array the light emitting devices on the plane of the base body at intervals, and since the second insulating layer is formed so as to cover the light emitting devices and then the electrodes of each of the light emitting devices are extracted via the connection holes formed in the second insulating layer and connected to drive circuits, it is possible to provide the display unit capable of significantly reducing the cost per unit area of the display unit.

According to an embodiment of the invention, there is provided a method of fabricating a display unit, wherein each of the semiconductor light emitting devices is buried in the first insulating layer except an upper end portion and a lower end plane thereof, and the upper end side electrode and the lower end side electrode are extracted to the upper surface of the first insulating layer. With this method of fabricating a display unit, it is possible to provide the display unit capable of facilitating the extraction of the upper end side electrode, and preventing a reduction in light emission area due to extraction of the lower end side electrode to the lower end plane.

According to an embodiment of the invention, there is provided a method of fabricating a display unit, wherein the upper end side electrode and the lower end side electrode of each of the semiconductor light emitting devices having been extracted to the upper surface of the first insulating layer are both extracted to the upper surface of the second insulating layer; and either of the electrodes is led to a connection electrode provided on the plane of the base body. With this method of fabricating a display unit, since one electrode is connected to a drive circuit on the upper surface of the second insulating layer and the other electrode is connected to a drive circuit on the plane of the base body, the drive circuits for the electrodes located in the directions perpendicular to each other do not cross each other, so that it is possible to provide the display unit capable of simplifying the wiring.

According to an embodiment of the invention, there is provided a method of fabricating a display including a plurality of semiconductor light emitting devices mounted in array on a plane of a base body The method includes the steps of fixedly arraying the semiconductor light emitting devices on the plane of the base body at intervals in a state being bared; forming a second insulating layer on the plane of the base body so as to cover the semiconductor light emitting devices; and forming specific connection holes in the second insulating layer, and extracting an upper end side electrode and a lower end side electrode of each of the semiconductor light emitting devices via the connection holes. With this method of fabricating a display unit, since the semiconductor light emitting devices, each of which is in the state being bared, that is, with its size not enlarged, are arrayed on the plane of the base body at intervals, some ingenuity is required in handling the semiconductor light emitting devices; however, it is possible to omit the device burying step, and to significantly reduce the cost per unit area of the display unit.

According to an embodiment of the invention, there is provided a method of fabricating a display unit, wherein the upper end side electrode and the lower end side electrode of each of the semiconductor light emitting devices in the state being bared are extracted to the upper surface of the second insulating layer; and either of the electrodes is led to a connection electrode provided on the plane of the base body. With this method of fabricating a display unit, it is possible to prevent a reduction in light emission area due to extraction of the lower end side electrode to the lower end plane of the semiconductor light emitting device. Also, since one electrode is connected to a drive circuit on the upper surface of the second insulating layer and the other electrode is connected to a drive circuit on the plane of the base body, the drive circuits for the electrodes located in the directions perpendicular to each other do not cross each other. As a result, it is possible to simplify the wiring.

According to an embodiment of the invention, there is provided a method of fabricating a display unit, wherein each of the first insulating layer and the second insulating layer is made from a polymer compound formable into a coating film, the polymer compound includes a polyimide resin, an ultraviolet curing resin, an epoxy resin, a synthetic rubber and/or the like. With this method of fabricating a display unit, it is possible to easily form the insulating layer even on the plane, having a large area, of the base body by coating, and hence to simplify the mounting of the semiconductor light emitting devices on the plane of the base body.

According to an embodiment of the invention, there is provided a method of fabricating a display unit, wherein each of the semiconductor light emitting devices mainly emits light in a direction from a light emission region to the lower end plane, mounted on the plane of the base body, of the semiconductor light emitting device; and the semiconductor light emitting device has, at a position over the light emission region, a reflection mirror from which the light is reflected downwardly. With this method of fabricating a display unit, it is possible to provide the display unit capable of effectively directing light from the light emission region to the lower end plane of the semiconductor light emitting device by means of the reflection mirror.

According to an embodiment of the invention, there is provided a method of fabricating a display unit, wherein the semiconductor light emitting device is formed into a pyramid shape or a truncated pyramid shape; and any one of at least tilt planes among planes of the pyramid or truncated pyramid shaped semiconductor light emitting device is taken as the reflection mirror. With this method of fabricating a display unit, it is possible to provide the display unit capable of concentrating light emitted from the light emission region to the lower end plane of the semiconductor light emitting device by using the tilt planes of the polygonal pyramid or the truncated polygonal pyramid as the reflection mirrors or using the upper plane of the truncated polygonal pyramid as the reflection mirror.

According to an embodiment of the invention, there is provided a method of fabricating a display unit, wherein the semiconductor light emitting device is made from a gallium nitride based semiconductor having a hexagonal system; and the semiconductor light emitting device includes an active layer formed in parallel to a (1-101) plane. With this method of fabricating a display unit, since the gallium nitride based semiconductor exhibits a high light emission efficiency at the (1-101) plane, it is possible to provide the display unit having an excellent light emission characteristic.

According to an embodiment of the invention, there is provided a method of fabricating a display unit, wherein the semiconductor light emitting device is made from a gallium nitride based semiconductor formed by crystal growth on a growth substrate into a hexagonal pyramid shape or a truncated hexagonal pyramid shape with a (0001) plane taken as the lower end plane and (1-101) planes and planes equivalent thereto taken as the tilt planes; and the semiconductor light emitting device includes an active layer formed in parallel to the (1-101) planes and planes equivalent thereto. With this method of fabricating a display unit, since light emission is concentrated to the lower end plane of the semiconductor light emitting device with an electrode plane provided on the (1-101) plane parallel to the active layer exhibiting a high light emission efficiency taken as the reflection mirror, it is possible to provide the display unit having an excellent light emission characteristic.

Additional features and advantages of the present invention are described in, and will be apparent from, the following Detailed Description of the Invention and the figures.

DETAILED DESCRIPTION OF THE INVENTION

Figure 1:
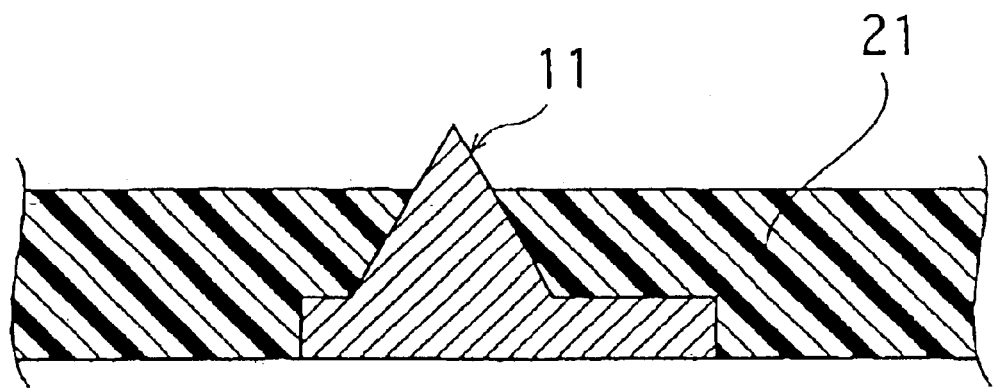
FIG. 1 is a sectional view showing a state that a micro-sized GaN based semiconductor light emitting device is buried in a first insulating layer (epoxy resin) except an upper end portion and a lower end plane of the light emitting device, according to an embodiment of the present invention.

As described above, according to an embodiment of the present invention, there are provided display units including a plurality of semiconductor light emitting devices mounted in array on a plane of a base body, and a methods of fabricating the display units. The semiconductor light emitting devices are fixedly arrayed on the plane of the base body at intervals in a state being buried in a first insulating layer or in a bare state being not buried in the first insulating layer. A second insulating layer is formed on the plane of the base body so as to cover the semiconductor light emitting devices. An upper end side electrode and a lower end side of each of the semiconductor light emitting devices are extracted via connection holes formed in specific positions of the first insulating layer and the second insulating layer.

The semiconductor light emitting device used for the display unit may be configured such that when a current is injected to a junction plane between a p-type semiconductor and an n-type semiconductor in the normal direction, positive holes and electrons as carriers are recombined with each other, to thereby cause light emission. The materials for forming the semiconductor light emitting device are not particularly limited. As the semiconductor allowing emission of light, there is known a gallium based compound semiconductor, examples of which include gallium nitride (GaN) allowing emission of blue light, gallium phosphide (GaP) allowing emission of green light, gallium arsenic phosphide (GaAsP) allowing emission of red light, and aluminum gallium arsenide (AlGaAs). In addition, zinc selenide (ZnSe) or silicon carbide (SiC) is known as a material allowing emission of light. Of course, any other material allowing emission of light may be used.

For a semiconductor light emitting device including GaN based semiconductors, a p-type GaN based semiconductor is obtained by doping an acceptor impurity such as Mg, Zn, or C in crystal and an n-type GaN based semiconductor is obtained by doping a doner impurity such as Si, Ge, or Se in crystal, and the pn-junction is preferably configured as a hetero-junction, more preferably, as a double hetero-junction in which an active layer made from InGaN is sandwiched between an n-type cladding layer made from GaN based semiconductor doped with Si and a p-type cladding layer made from a GaN based semiconductor doped with Mg. The semiconductor light emitting device having such a configuration is able to exhibit a significantly excellent light emission characteristic. In addition, the active layer may be of a single bulk structure or a quantum well structure.

The compound semiconductor as the material of the semiconductor light emitting device is fabricated by a metalorganic chemical vapor deposition (MOCVD) process, a molecular beam epitaxy (MBE) process, or a hydride vapor-phase epitaxy (HVPE) process, and therefore, the compound semiconductor is expensive. Accordingly, the size of the semiconductor light emitting device is desirable to be made as small as possible insofar as it is allowed to be handled. Such micro-sized semiconductor light emitting devices can be obtained by fabricating a compound semiconductor wafer for semiconductor light emitting devices and cutting the wafer into chips; however, they can be more easily fabricated by selective crystal growth of compound semiconductors, for example, on a sapphire substrate. For example, semiconductor light emitting devices each having a size (length of one size of the lower end plane) in a range of about 100 to 200 micrometers or less, particularly, in a range of about 10 to 50 micrometers can be obtained by such selective crystal growth. If needed, each of the semiconductor light emitting devices thus formed by crystal growth may be subjected to a treatment of adjusting a three-dimensional shape thereof.

For the micro-sized semiconductor light emitting device thus obtained, a p-electrode made from typically Ni/Au is mounted to the p-type semiconductor by vapor-deposition, and an n-electrode made from typically Ti/Au is mounted to the n-type semiconductor. The micro-sized semiconductor light emitting device provided with the electrodes may be fixedly arrayed on a plane of a base body as it is; however, to facilitate the handling of the micro-sized semiconductor light emitting device, the light emitting device may be buried in a first insulating layer to form a resin-covered chip having a large apparent size, and then the resin-covered chip be fixedly arrayed on the plane of the base body. To improve the light emission characteristic toward the front surface side of the display unit, the three-dimensional shape of each of the semiconductor light emitting devices constituting the display unit is required to be taken into account. Hereinafter, there will be described the arraying and fixture of micro-sized semiconductor light emitting devices on a plane of a transparent base body taken as a front panel of a display unit and the shape of each of the micro-sized semiconductor light emitting devices required for enhancing the light emission characteristic toward the front surface side of the display unit.

[Arraying of Micro-sized Semiconductor Light Emitting Device in the Form of Chip having Large Apparent Size]

The arraying of micro-sized semiconductor light emitting devices in the form of chips having large apparent sizes will be described below. Micro-sized semiconductor light emitting devices (size: for example, 10 to 100 micrometers) formed on a plane of a growth substrate by crystal growth are fixed on a plane of a transparent support with a specific pitch (for example, 100 to 300 micrometers), and a first insulating layer is formed so as to bury the semiconductor light emitting devices except the upper end portions and lower end planes thereof and is diced into resin-covered chips having large apparent sizes. In this case, the dicing is made such that the micro-sized semiconductor light emitting device is located at a central portion of the resin-covered chip. The reason why the upper end portion of each of the semiconductor light emitting device is not buried in the first insulating layer is that an electrode is to be extracted from the upper end portion, and the reason why the lower end plane of each of the semiconductor light emitting devices is not buried in the first insulating layer is that the lower end plane is taken as a light emergence plane. It is to be noted that the electrode may be extracted to the lower end plane. A polyimide adhesive may be used to fix the GaN based semiconductor light emitting devices to the transparent support. In this case, by irradiating the polyimide adhesive with laser beams from the transparent support side as needed, the transparent support can be easily removed from the semiconductor light emitting devices due to laser abrasion of polyimide. Alternatively, an ultraviolet-curing sticker may be used to fix the GaN based semiconductor light emitting devices to the transparent support. In this case, by irradiating the ultraviolet-curing sticker with laser beams from the transparent support side after formation of the first insulating layer, to cure the sticker, thereby eliminating the stickiness of the sticker, so that the transparent support can be easily removed from the semiconductor light emitting devices.

The material of the first insulating layer may be either an organic matter or an inorganic matter, and the material type and formation manner thereof are not particularly limited; however, from the viewpoint of reducing the cost of a display unit, the use of an organic matter is superior to the use of an inorganic matter. The reason for this is that although an insulating layer made from an inorganic matter such as $SiO_2$ or $Si_3N_4$ is required to be formed by a CVD (Chemical Vapor Deposition) process, a vapor-deposition process, or a sputtering process, an insulating layer made from an organic matter, for example, a polymer compound such as an epoxy resin, a polyimide resin, or a synthetic rubber can be easily formed by a simple coating process even if a plane of a base body has a large area. In addition, a spin-on-glass film can be used as an insulating film formed by coating.

Since the semiconductor light emitting devices having been buried in the first insulating layer and diced into resin-covered chips will be fixedly arrayed on a plane of a base body with a specific pitch (for example, 300 to 900 micrometers) and then buried in a second insulating layer, electrodes are preferably extracted from each of the semiconductor light emitting devices for easy connection to drive circuit. Assuming that a p-electrode is provided on the upper end portion and an n-electrode is provided on the lower end portion, a conductive metal is formed on the first insulating layer to cover the p-electrode on the exposed upper end portion. As a result, the p-electrode can be extracted to the conductive metal having a large area on the upper surface of the first insulating layer. Accordingly, it is possible to form a connection hole extending from a second insulating layer to the conductive metal (connected to the p-electrode) on the first insulating layer without occurrence of any positional deviation thereof.

With respect to the extraction of the n-electrode, a connection hole is formed in the upper surface of the first insulating layer to a depth reaching the n-electrode on the lower end portion and a conductive metal is formed on the upper surface of the first insulating layer so as to bury the connection hole, so that the n-electrode can be extracted to the conductive metal having a large area on the upper surface of the first insulating layer. In addition, as described above, the n-electrode may be extracted to the lower end plane of the semiconductor light emitting device. In this case, since the lower end plane is taken as a light emission plane, a transparent extraction electrode may be provided in order not to obstruct light emission outward from the lower end plane.

The semiconductor light emitting devices in the form of the resin-covered chips each having a large apparent size are, as described above, fixedly arrayed on a transparent base body taken as a display panel of a display unit with a pitch of about 300 to 900 micrometers. In general, the semiconductor light emitting devices are one-dimensionally or two-dimensionally arrayed; however, they may be three-dimensionally arrayed. The fixture of the semiconductor light emitting devices having been arrayed may be performed in the same manner as that used for burying the semiconductor light emitting devices in the first insulating layer to form the resin-covered chips each having a large apparent size. That is to say, a second insulating layer is formed on the plane of the base body to cover the semiconductor light emitting devices having been fixedly arrayed on the plane of the base body. The second insulating layer may be made from an inorganic matter or an organic matter; however, the second insulating layer is preferably made from the same material as that forming the first insulating layer. If the second insulating layer is made from an insulating material different from that forming the first insulating layer, there may occur a lack of an adhesive force at the interface between the stacked first and second insulating layers or a problem caused by a difference in thermal expansion coefficient therebetween.

After the semiconductor light emitting devices each of which has been buried in the first insulating layer are covered with the second insulating layer, the p-electrode and the n-electrode of each of the semiconductor light emitting devices extracted to the upper surface of the first insulating layer are further extracted to the upper surface of the second insulating layer and connected to respective drive circuits. The connection of the electrodes can be made by various methods. One example of the connection methods is as follows: namely, two connection holes are formed in the upper surface of the second insulating layer to depths reaching the upper surface of the first insulating layer, and the p-electrode and the n-electrode are extracted to the upper surface of the second insulating layer via the connection holes; and for example, the extracted p-electrode is connected to the corresponding drive circuit on the upper surface of the second insulating layer, and the extracted n-electrode is connected to a conductive metal buried in a connection hole formed in the second insulating layer to a depth reaching a connection electrode on the plane of the base body, to be thus connected to the corresponding drive circuit on the plane of the base body via the connection electrode.

[Arraying Micro-sized Semiconductor Device as being Bared]

If each of micro-sized semiconductor light emitting devices has a size of about 100 to 200 micrometers, they can be directly, fixedly arrayed on a plane of a transparent base body in a state being bared, that is, without being buried in an insulating layer to form resin-covered chips each having a large apparent size. Even semiconductor light emitting devices each having a size of 100 micrometers or less can be of course handled as being bared. Upper end portions of bared semiconductor light emitting devices may be picked up and arrayed on a plane of a base body with a specific pitch by making use of means such as attraction under vacuum and release under atmospheric pressure, or stickiness by an ultraviolet-curing sticker and elimination of the sticky force of the sticker by irradiation thereof with ultraviolet light from the base body plane side.

Specifically, semiconductor light emitting devices picked up are fixedly arrayed on a plane of a base body coated with a transparent adhesive with a pitch of, for example, 300 to 900 micrometers. In this case, the lower end planes of the semiconductor light emitting devices may be coated with a transparent adhesive. Subsequently, a second insulating layer is directly formed so as to cover the semiconductor light emitting devices having been adhesively fixed to the plane of the base body. The extraction of electrodes of each of the semiconductor light emitting devices to the upper surface of the second insulating layer may be performed in the same manner as that used for extracting the electrodes of each of the semiconductor light emitting devices to the upper surface of the first insulating layer covering the semiconductor light emitting devices to form the resin-covered chips each having a large apparent size.

[Three-dimensional Shape of Semiconductor Light Emitting Device]

With respect to each of semiconductor light emitting devices fixedly arrayed on a plane of a transparent base body, the luminance of the light emitting device toward the base body plane side, that is, toward the lower end plane side of the device can be improved by changing the shape of the device. Of light emitted from a light emission region (active layer) of a semiconductor light emitting device, a light component directed upwardly from the light emission region can be directed to the lower end plane side by using an electrode plane or the like on the upper end portion as a reflection mirror; however, a light component directed to a side plane perpendicular to the lower end plane is less directed toward the lower end plane even if being reflected from the side plane. Accordingly, the semiconductor light emitting device is desirable to have a tilt plane tilted from the lower end plane at an angle in a range of 45±20°. By providing a reflection mirror on such a tilt plane, the light component directed sideways is reflected from the reflection mirror, to be effectively directed to the lower end plane. The tilt plane is not necessarily configured as a smooth plane such as a mirror plane. It is to be noted that in the case where the tilt plane is tilted from the lower end plane at an angle out of the above-described range, even if the light component directed sideways is reflected therefrom, the quantity of light directed to the lower end plane is not increased so much, thereby failing to obtain the effect of enhancing the luminance.

The tilt plane may be a shed roof like tilt plane, a gable roof like tilt plane, or a pavilion roof like tilt plane. Also, a semiconductor light emitting device may be formed into a pyramid shape or a truncated pyramid shape. The tilt plane of such a pyramid shape or a truncated pyramid shape, or an upper plane of the truncated pyramid shape can be taken as a reflection mirror. With this configuration, it is possible to more effectively direct light emitted from a light emission region to the lower end plane of the semiconductor light emitting device. The term "pyramid" includes a triangular pyramid, a quadrangular pyramid, a pentagonal pyramid, a hexagonal pyramid, and a polygonal pyramid close to a cone, and the term "truncated pyramid" includes truncated pyramids corresponding to the above pyramids. Further, a semiconductor light emitting device may have, in its upper end portion, a caldera-shaped recess having a tilt plane in the above range of 45±20°. The semiconductor light emitting having the above-described tilt plane may be naturally obtained by selective crystal growth or may be obtained by surface working after selective crystal growth. Alternatively, when a wafer is cut into micro-sized semiconductor light emitting devices, a tilt plane may be given to each of the semiconductor light emitting device. As working means for giving the above tilt plane, ion beams or laser beams may be used.

Of compound semiconductors used for semiconductor light emitting devices, gallium phosphide (GaP) allowing emission of green light, or gallium arsenic phosphide (GaAsP) or aluminum gallium arsenide allowing emission of red light belongs to a cubic system and is formed into a hexahedron shape by selective crystal growth, and accordingly, the compound semiconductor has no tilt plane with respect to the lower end plane. For such a compound semiconductor, therefore, it may be desirable to provide a tilt plane as a reflection mirror after selective crystal growth. On the other hand, a GaN based semiconductor allowing emission of blue light belongs to a hexagonal system and has a hexagonal column or hexagonal pyramid shape crystal structure, and more specifically, when the GaN semiconductor is formed on a (0001) plane of a sapphire substrate by sufficient selective crystal growth, the GaN based semiconductor has a hexagonal pyramid shaped crystal structure including a (1-101) plane tilted from the lower end plane and a plane equivalent thereto, and when the GaN based semiconductor is formed by less selective crystal growth, the GaN based semiconductor has a truncated pyramid shaped crystal structure. Further, Japanese Patent No. 2830814 describes a semiconductor formed on a (1-101) plane of a sapphire substrate by selective crystal growth has a trapezoidal cross-section in which an upper plane parallel to the lower end plane becomes the (1-101) plane, and tilt planes on both sides become the (1-101) plane and a (0111) plane. The semiconductor light emitting device of the present invention may be a semiconductor light emitting device having the above-described tilt plane. By the way, a GaN based semiconductor light emitting device is formed into a shape similar to an inverted ship's bottom depending on the condition of crystal growth on the (0001) plane of a sapphire substrate. The semiconductor light emitting device of the present invention may be a semiconductor light emitting device having such a tilt plane.

Since light emitting diodes representative of semiconductor light emitting devices are, as described above, of three kinds allowing emission of red light (R), green light (G), and blue light (B) depending on the materials thereof, it is possible to fabricate a full-color image display unit having a high luminance by using a combination of these light emitting diodes of three kinds as pixels. Since the light emitting diode can be easily changed into a semiconductor laser by providing a resonance mirror thereon, it is possible to fabricate a lighting unit or a traffic sign by using one kind of semiconductor lasers allowing emission of a single color or using three kinds of semiconductor lasers allowing emission of three primary colors.

Hereinafter, embodiments of the display unit and the fabrication method thereof according to the present invention will be described with reference to the drawings.

(Embodiment 1)

Figure 2:
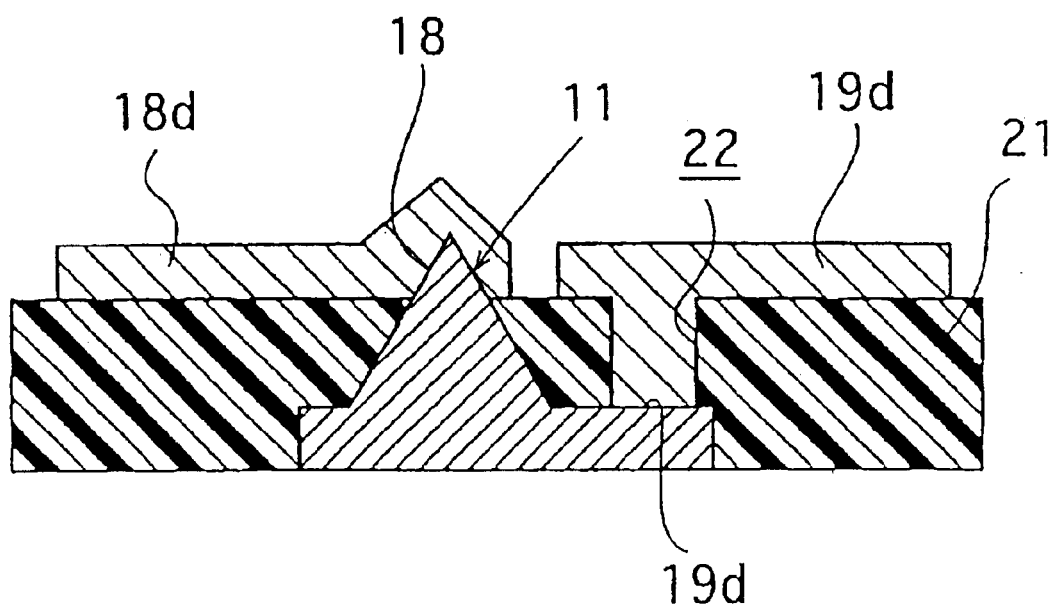
FIG. 2 is a sectional view showing a state, subsequent to the state shown in FIG. 1, that a connection hole is formed in the upper surface of the first insulating layer to a depth reaching a lower end side electrode of the GaN based semiconductor light emitting device, an aluminum film is formed over the entire surface of the first insulating layer by vapor-deposition or sputtering and is patterned by photolithography and etching, and a p-electrode on the upper end side and an n-electrode on the lower end side are extracted to the upper surface of the first insulating layer, according the an embodiment of the present invention.

FIGS. 1 and 2 are sectional views showing a production step of burying a micro-sized GaN based semiconductor light emitting device 11 in a polymer compound, to form a resin-covered chip having a large apparent size, thereby facilitating the handling of the light emitting device 11. Referring to FIG. 1, the GaN based semiconductor light emitting devices 11, each having a size (which is the length of the long side of the lower end surface) of 100 micrometers, are disposed on a surface of a transparent support (not shown) with a pitch of 310 micrometers and are fixed thereon by means of a polyimide adhesive (not shown), and a solution of an epoxy resin is applied to the GaN based semiconductor light emitting devices 11 excluding the upper and lower end portions thereof, being dried, and cured, to form an insulating layer 21, whereby the GaN based semiconductor light emitting devices 11 are buried in the insulating layer 21. It is noted that one of the GaN based semiconductor light emitting devices 11 buried in the insulating layer 21 is shown in FIG. 1.

Figure 3A:
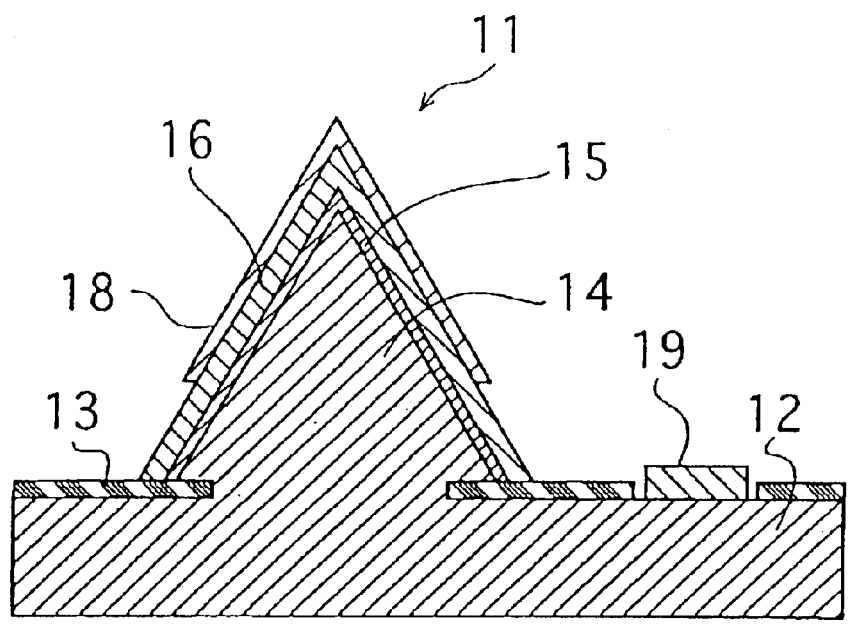
FIGS. 3A and 3B are a sectional view and a plan view showing a detail structure of a GaN based semiconductor light emitting device formed into a hexagonal pyramid shape by crystal growth, respectively, according to an embodiment of the present invention.
Figure 3B:
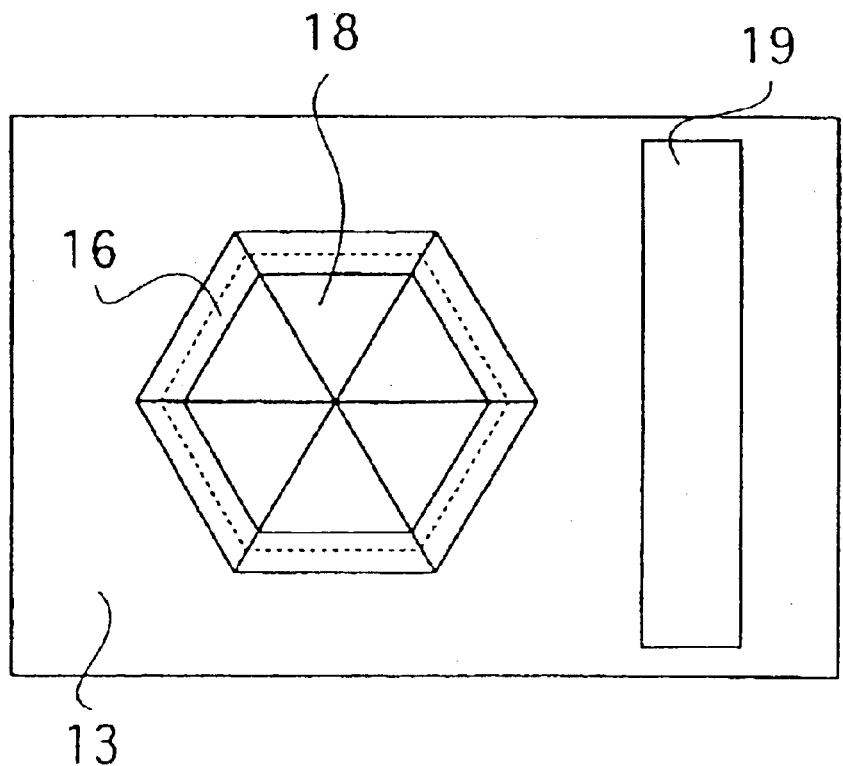

FIGS. 3A and 3B are a sectional view and a plan view showing the detailed structure of the GaN based semiconductor light emitting device 11, respectively. An SiO2 mask is formed on a (0001) plane of a sapphire substrate (not shown). A buffer layer is formed in an opening portion of the SiO2 mask in a flat plate-shape at a temperature of 500° C., and an n-type gallium nitride (GaN:Si) 12 doped with silicon is formed on the buffer layer in a flat plate-shape at 1000° C. An SiO2 mask 13 is formed on the n-type gallium nitride 12, and a hexagonal pyramid shaped n-type semiconductor (GaN:Si) 14 is formed by crystal growth from the opening portion of the SiO2 mask 13. An active layer 15 made from InGaN is formed on (1-101) planes of the hexagonal pyramid of the n-type semiconductor 14 and tilt planes equivalent thereto at a growth temperature lower than 1000° C. A p-type gallium nitride layer (GaN:Mg) 16 doped with magnesium is grown on the active layer 15. An Ni/Au film is then formed on the p-type (GaN:Mg) layer 16 as the surface layer portion by vapor-deposition, to form a p-electrode 18 serving as a reflection mirror against light emission. An opening portion is formed in the SiO2 mask 13 covering the upper surface of the flat-plate shaped under layer (GaN:Si) 12, and a Ti/Au film is formed in the opening portion of the SiO2 mask 13 by vapor-deposition, to form an n-electrode 19.

Referring again to FIG. 2, a connection hole 22 is formed in the first insulating layer 21, made from an epoxy resin, of the GaN based semiconductor light emitting device 11 shown in FIG. 1 to a depth reaching the n-electrode 19 provided on the under layer 12 of the light emitting device 11. An aluminum film is formed over the entire surface of the first insulating layer 21 so as to cover the light emitting device 11 by vapor-deposition or sputtering. The aluminum film is patterned by lithography and etching, to form an extraction electrode 18d connected to the p-electrode 18 on the upper end side and an extraction electrode 19d connected to the n-electrode 19 on the under layer 12. The first insulating layer 21 is then diced into chips each having a size of 300 micrometers. It is to be noted that the dicing is performed such that the GaN based semiconductor light emitting device 11 is located at an approximately central portion of the chip. The transparent support is irradiated with laser beams, to cause abrasion of the polyimide adhesive, and then the transparent support is removed from the light emitting devices 11. In each resin-covered chip having a large apparent size formed by burying the semiconductor light emitting device 11 in the plastic material, the extraction electrodes 18d and 19d are connected to drive circuits. The array of the semiconductor light emitting devices 11 in the form of the resin-covered chips act as a display unit allowing emission of blue light toward the lower end surface side by injecting a current to each of the semiconductor light emitting devices 1.

(Embodiment 2)

Figure 4:
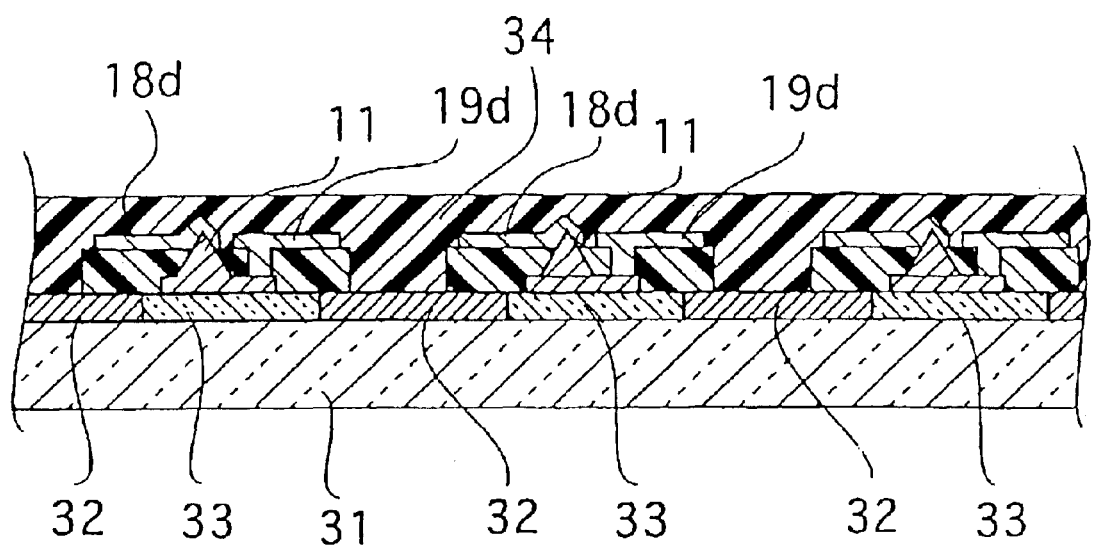
FIG. 4 is a sectional view showing a state that the GaN based semiconductor light emitting devices shown in FIG. 2 are arrayed on a transparent base body of a display unit at specific intervals and fixed thereon with a transparent adhesive, and then a second insulating layer (epoxy resin) is formed so as to cover the GaN based semiconductor light emitting devices according to an embodiment of the present invention.
Figure 5:
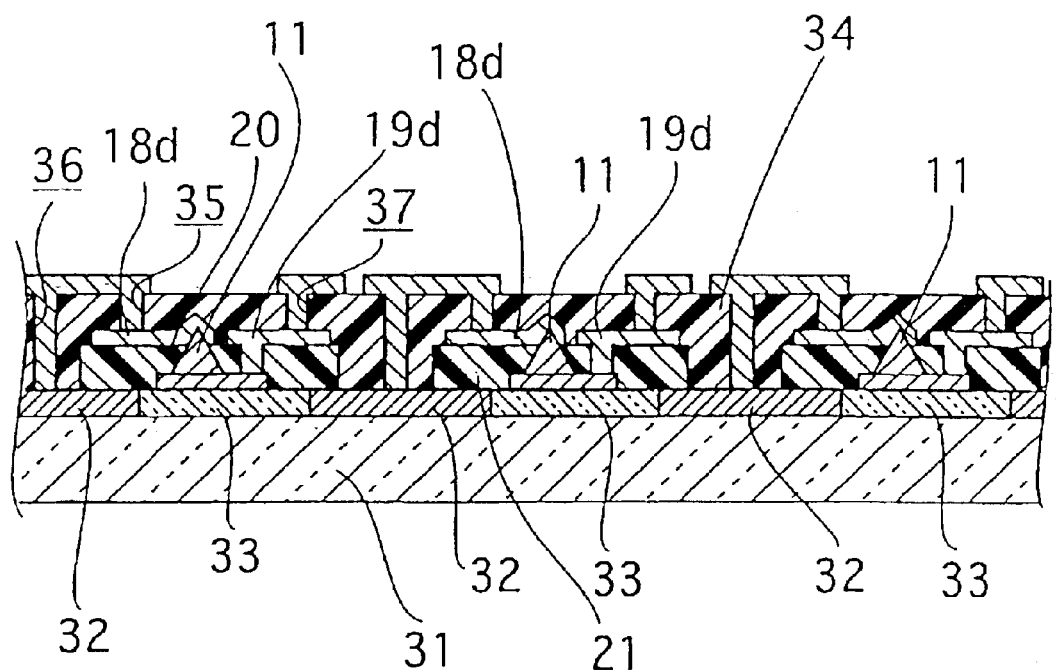
FIG. 5 is a sectional view showing a state, subsequent to the state shown in FIG. 4, that connection holes are formed at specific positions of the second insulating layer, and the p-electrode and the n-electrode having been extracted on the upper surface of the first insulating layer are extracted to the upper surface of the second insulating layer and further the p-electrode is led to a connection electrode provided on the plane of the base body via the connection holes according to an embodiment of the present invention.

FIGS. 4 and 5 are sectional views showing structures that the GaN based semiconductor light emitting devices 11 fabricated in Embodiment 1, each of which is buried in the first insulating layer 21 to form the resin-covered chip having a size of 300 micrometers, are fixedly arrayed on the upper surface of a base body 31 in such a manner as to be spaced from each other with a specific pitch. Concretely, in the structure shown in FIG. 4, the semiconductor light emitting devices II buried in the first insulating layer 21 made from an epoxy resin shown in FIG. 2 are fixedly arrayed on the transparent base body 31 taken as a display panel of a display unit in such a manner as to be spaced from each other with a pitch of 400 micrometers. In this case, connection electrodes 32 are provided on the upper surface of the base body 31 in such a manner as to be spaced from each other with a specific pitch, and each of the semiconductor light emitting devices 11 buried in the first insulating layer 21 is disposed between two of the connection, electrodes 32 and is fixed to the upper surface of the base body 31 by means of a transparent adhesive 33. A solution of an epoxy resin is then applied to cover the entire surfaces of the semiconductor light emitting devices 11 and the connection electrodes 32, being dried, and heated to be cured, to form a second insulating layer 34 made from an epoxy resin.

Referring to FIG. 5, for each of the semiconductor light emitting devices 11 shown in FIG. 4, two connection holes 35 and 36 are formed in the upper surface of the second insulating layer 34 to depths reaching an extraction electrode 18d of the GaN based semiconductor light emitting device 11 and reaching the connection electrode 32 on the upper surface of the base body 31, respectively, and further, a connection hole 37 is formed in the upper surface of the second insulating layer 34 to a depth reaching an extraction electrode 19d of the GaN based semiconductor light emitting device 11. An aluminum film is formed over the entire surface of the second insulating layer 34 by vapor-deposition or sputtering, and is patterned by lithography and etching, so that a p-electrode 18 of the GaN based semiconductor light emitting device 11 is connected to a drive circuit (not shown) on the upper surface of the base body 31, and an n-electrode 19 of the GaN based semiconductor light emitting device 11 is connected to a drive circuit (not shown) on the upper surface of the second insulating layer 34. Since the GaN based semiconductor light emitting device 11 having a micro size is buried in the first insulating layer made from an epoxy resin to form a resin-covered chip having a large apparent size as described above, it is possible to facilitate the handling of the semiconductor light emitting device 11, and since the extraction electrodes 18d and 19d each having a large area are provided on the upper surface of the second insulating layer 21, it is possible to obtain a merit in facilitating extraction of the electrodes from the second insulating layer 34 made from an epoxy resin in the subsequent step.

(Embodiment 3)

Figure 6:
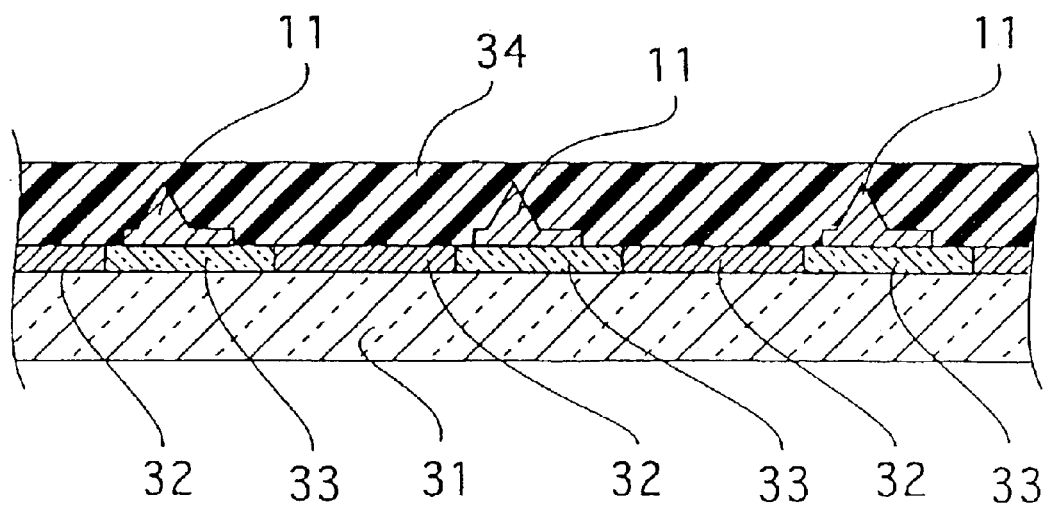
FIG. 6 is a sectional view showing a state that bare GaN based semiconductor light emitting devices not buried in any first insulating layer are arrayed on a transparent base body of a display unit at specific intervals and fixed thereon with a transparent adhesive, and then a second insulating layer is formed so as to cover the GaN based semiconductor light emitting devices according to an embodiment of the present invention.
Figure 7:
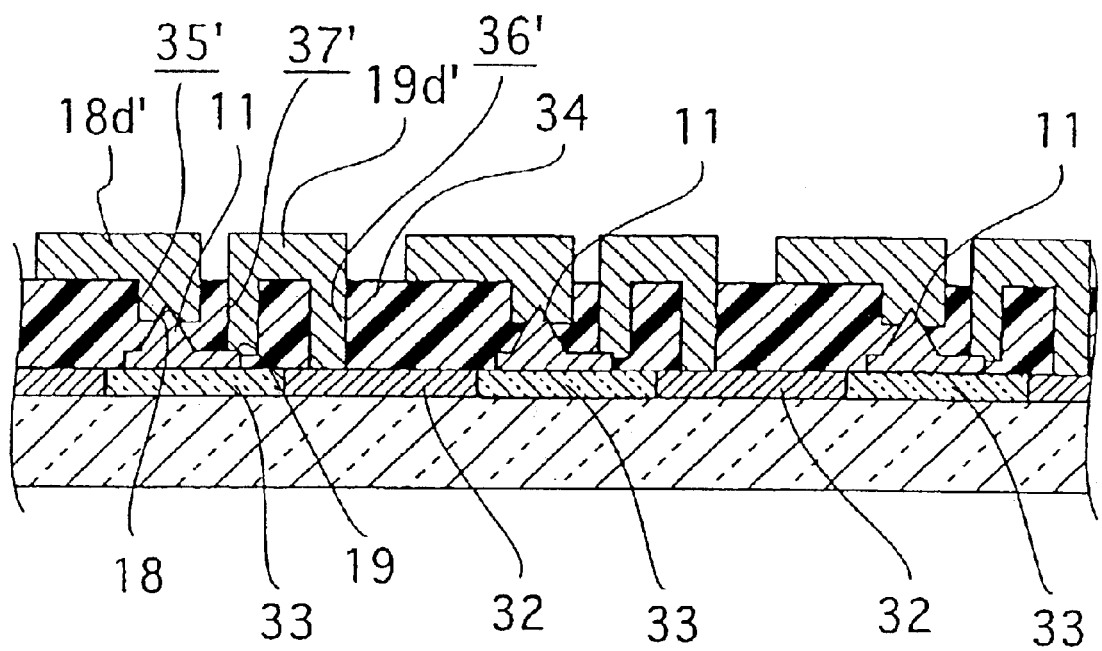
FIG. 7 is a sectional view showing a state, subsequent to the state shown in FIG. 6, that connection holes are formed at specific positions of the second insulating layer, and a p-electrode and an n-electrode of each of the bare GaN based semiconductor light emitting devices are extracted to the upper surface of the second insulating layer and further the n-electrode is led to a connection electrode provided on the plane of the base body via the connection holes according to an embodiment of the present invention.

FIGS. 6 and 7 are sectional views showing structures that GaN based semiconductor light emitting devices 11 each having a micro-size, which are not formed into resin-covered chips having large sizes by burying the light emitting devices 11 in an insulating layer but are left as bared, are fixedly arrayed on the upper surface of a base body 31 taken as a display panel of a display unit. Concretely, in the structure shown in FIG. 6, connection electrodes 32 are provided on the upper surface of the base body 31 in such a manner as to be spaced from each other with a specific pitch, and the GaN based semiconductor light emitting devices 11, each having a size of 100 micrometers, are picked up as bared by a vacuum attracting chuck, and are disposed on the upper surface of the base body 31 with a pitch of 400 micrometers and fixed thereto by means of a transparent adhesive 33. In this case, each of the light emitting devices 11 is located between two of the connection electrodes 32. A solution of an epoxy resin is then applied to cover the entire surfaces of the light emitting devices 11 and the connection electrodes 32, being dried, and heated to be cured, to form a second insulating layer 34.

Referring to FIG. 7, for each of the light emitting devices 11 shown in FIG. 6, three connection holes 35', 36' and 37' are formed in the second insulating layer 34 made from an epoxy resin to depths reaching a p-electrode 18 of the GaN based semiconductor light emitting device 11, the connection electrode 32 on the upper surface of the base body 31, and an n-electrode 19 of an under layer 12 of the GaN based semiconductor light emitting device 11, respectively. An aluminum film is formed over the entire surface of the second insulating layer 34 by vapor-deposition or sputtering, and is patterned by lithography and etching, so that the p-electrode 18 of the GaN based semiconductor light emitting device 11 is connected to a drive circuit (not shown) on the upper surface of the base body 31, and the n-electrode 19 is connected to a drive circuit (not shown) on the second insulating layer 34. Even in this case, since the GaN based semiconductor light emitting devices 11, each of which has a micro-sized and is thereby fabricated at a low cost, are disposed on the upper surface of the base body 31 with a specific pitch, it is possible to reduce the cost of a display unit fabricated by using the array of the GaN based semiconductor light emitting devices 11.

It is to be noted that the display unit and the fabrication method thereof according to the present invention are not limited to the above-described embodiments, and may be variously varied without departing from the scope of the present invention.

Figure 8:
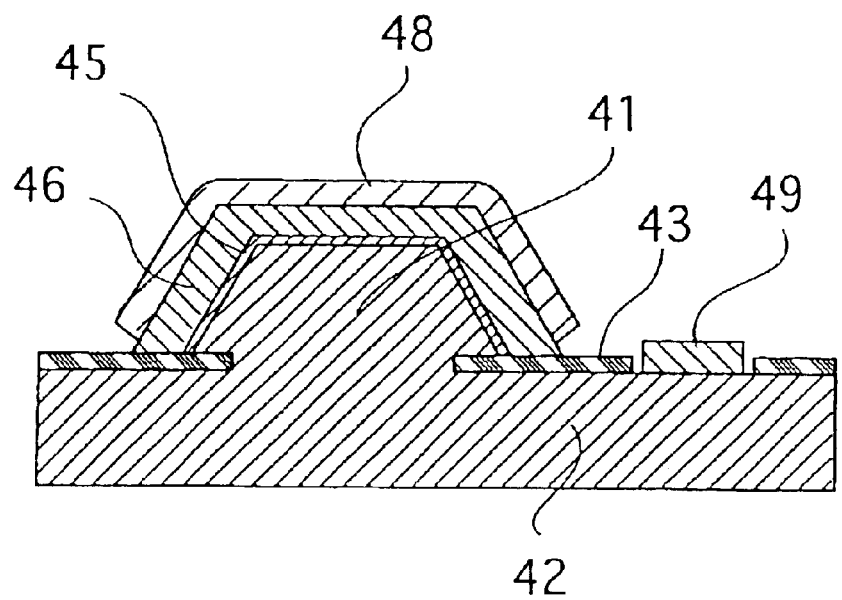
FIG. 8 is a sectional view of a GaN based semiconductor light emitting device formed into a truncated hexagonal pyramid shape by crystal growth according to an embodiment of the present invention.

For example, the display unit described in each of Embodiments 1 and 2 is fabricated by using the micro-sized hexagonal pyramid shaped GaN based semiconductor light emitting devices 11; however, the display unit according to an embodiment of the present invention may be fabricated by using another type GaN based semiconductor light emitting device having a micro-sized crystal structure. FIG. 8 is a sectional view showing a truncated hexagonal pyramid shaped GaN based semiconductor light emitting device. In fabrication of this light emitting device, like the fabrication of the hexagonal pyramid shaped semiconductor light emitting device shown in FIGS. 3A and 3B, GaN based semiconductor is formed on the (0001) plane of a sapphire substrate by selective crystal growth. In this case, a time required for selective crystal growth is set to be shorter than that for selective crystal growth in the fabrication of the hexagonal pyramid shaped semiconductor light emitting device shown in FIGS. 3A and 3B, to form a truncated hexagonal pyramid shaped n-type (GaN:Si) semiconductor 41. An active layer 45 made from InGaN is formed on the (0001) plane, which is the upper plane parallel to the lower end plane of the n-type (GaN:Si) semiconductor 41, and on (1-101) planes equivalent to the tilt planes of the hexagonal pyramid, and a p-type (GaN:Mg) semiconductor layer 46 is grown on the active layer 45. An Ni/Au film is formed on the p-type (GaN:Mg) semiconductor layer 46 as the surface layer portion by vapor-deposition, to form a p-electrode 48.

An SiO2 mask 43 is formed on an under layer 42 formed by a flat-plate shaped n-type (GaN:Si) semiconductor, and a Ti/Au film is formed on the upper surface of a portion, exposed from an opening portion of the SiO2 mask 43, of the under layer 42 by vapor-deposition, to form an n-electrode 49. In this light emitting device, the tilt planes and the upper planes of the truncated hexagonal pyramid act as reflection mirrors against light emission.

Figure 9:
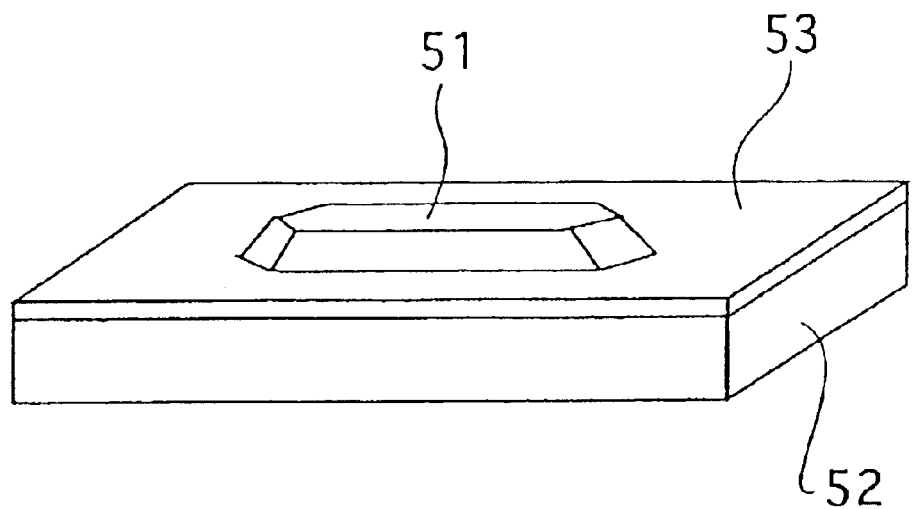
FIG. 9 is a perspective view of a truncated hexagonal pyramid shaped GaN based semiconductor light emitting device formed by crystal growth from an opening portion of a rectangular mask longer in a specific direction according to an embodiment of the present invention.
Figure 10:
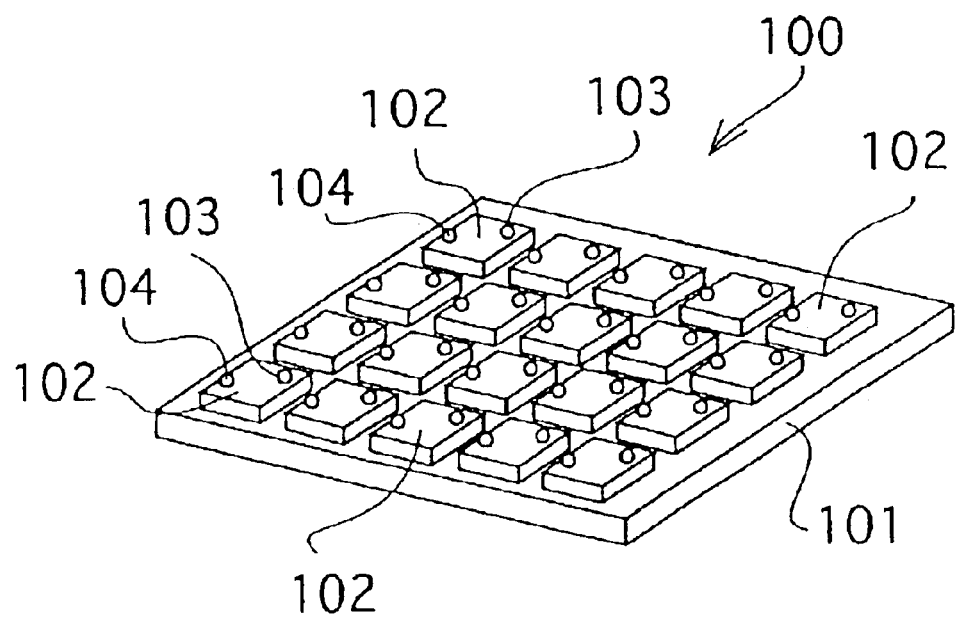
FIG. 10 is a perspective view of a rear side of an essential portion of a related art display unit including light emitting diodes, in which relatively large standardized size of modules are densely arrayed.
Figure 11:
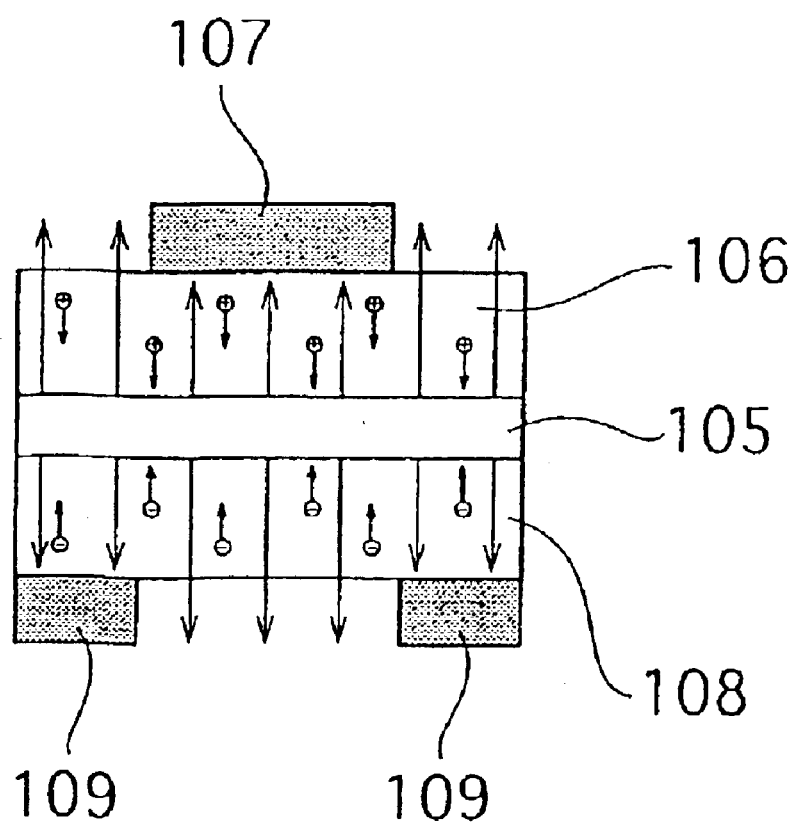
FIG. 11 is a sectional view typically showing a light emitting diode.

FIG. 9 shows a further GaN based semiconductor light emitting device 51 having a crystal structure different from that shown in FIGS. 3A and 3B. As shown in this figure, an n-type (GaN:Si) semiconductor is grown on the (0001) plane of a sapphire substrate, to form an under layer 52, and an SiO2 mask 53 is formed on the under layer 52. A rectangular opening portion longer in a <1-100> direction is provided in the mask 53, and a GaN based semiconductor 51 is formed by selective crystal growth from the opening portion of the mask 53. Such a GaN based semiconductor 51 is formed into a shape similar to that of an inverted ship's bottom, wherein the semiconductor 51 has (1-101) and (11-22) planes. The GaN based semiconductor light emitting device 51 having such tilt planes can be also used for a display unit.

In an embodiment, the (0001) plane of the sapphire substrate is used as a plane for crystal growth of a GaN based semiconductor of the semiconductor light emitting device of the present invention; however, another plane of the sapphire substrate may be used as the crystal growth plane, and further, a substrate other than the sapphire substrate, for example, a GaN wafer or an SiC wafer may be used as the substrate for crystal growth of a GaN based semiconductor of the semiconductor light emitting device of the present invention.

In an embodiment, each of the first and second insulating layers is made from an epoxy resin; however, it may be made from a thermosetting resin such as a heat-resisting polyimide resin, a thermoplastic resin such as vinyl chloride based copolymer, or a synthetic rubber such as polyurethane rubber. Alternatively, each of the first and second insulating layers may be formed by depositing an inorganic insulating material such as silicon oxide or silicon nitride in a layer structure.

In Embodiments 1 and 2, as shown in FIGS. 3A and 3B, the GaN based semiconductor light emitting device 11 is configured such that the p-type semiconductor 16 is located on the upper side and the n-type semiconductor 14 is located on the lower side; however, the semiconductor light emitting device 11 may be replaced with a semiconductor light emitting device configured such that the p-type semiconductor 16 is located on the lower side and the n-type semiconductor 14 is located on the upper side.

In the step of Embodiment 1 shown in FIG. 1, the semiconductor light emitting device 11 on which the p-electrode 18 and the n-electrode 19 have been already provided is used; however, in the step of forming the conductive metal film by vapor-deposition or sputtering, the electrodes may be formed and then extracted to the upper surface of the first insulating layer.

In an embodiment, the semiconductor light emitting device is exemplified by the light emitting diode; however, since a semiconductor laser can be obtained by providing resonators using both end planes of the light emitting diode as mirror surfaces, it is possible to fabricate a lighting unit or a traffic sign including one kind of semiconductor lasers allowing emission of a single color or three kinds of semiconductor lasers allowing emission of three primary colors.

The present invention configured as described above has the following effects:

According to the display unit in an embodiment, since the semiconductor light emitting devices are fixedly arrayed on the plane of the base body at intervals in a state being buried in a first insulating layer or in a bare state being not buried in the first insulating layer and are covered with the second insulating layer, followed by extraction of the electrodes of each of the semiconductor light emitting device, it is possible to reduce the occupied area of the semiconductor light emitting devices per unit area of the display unit and simplify the wiring, and hence to significantly reduce the cost.

According to the display unit in an embodiment, since each of the semiconductor light emitting devices is buried in the first insulating layer to form a resin-covered chip having a large size, it is possible to facilitate the handling of the semiconductor light emitting device, and since one electrode is connected to a drive circuit on the upper surface of the second insulating layer and the other electrode is connected to a drive circuit on the plane of the base body, the drive circuits for the electrodes located in the directions perpendicular to each other do not cross each other, so that it is possible to simplify the wiring and hence to reduce the cost.

According to the display unit in an embodiment, since the bare semiconductor light emitting devices are used, some ingenuity is required in handling the semiconductor light emitting devices; however, it is possible to omit the step of burying the semiconductor light emitting devices in the first insulating layer, and since one electrode is connected to a drive circuit on the upper surface of the second insulating layer and the other electrode is connected to a drive circuit on the plane of the base body, the drive circuits for the electrodes located in the directions perpendicular to each other do not cross each other, thereby simplifying the wiring.

According to the display unit in an embodiment, since each of the first insulating layer and the second insulating layer is made from a polymer compound formable into a coating film, it is possible to simply form the insulating layer even on the base body plane having a large area, and hence to reduce the cost.

According to the display unit in an embodiment, since the semiconductor light emitting device has, at a position over the light emission region, a reflection mirror from which the light is reflected downwardly, it is possible to effectively direct light from the light emission region to the lower end plane of the semiconductor light emitting device by means of the reflection mirror.

According to the display unit in an embodiment, since the semiconductor light emitting device is formed into a pyramid shape or a truncated pyramid shape and any one of at least tilt planes among planes of the pyramid or truncated pyramid shaped semiconductor light emitting device is taken as the reflection mirror, the light directed to the upper end portion of the semiconductor light emitting device can be more effectively directed to the lower end plane side of the semiconductor light emitting device.

According to the display unit in an embodiment, since the semiconductor light emitting device is made from a gallium nitride based semiconductor having a hexagonal system and the semiconductor light emitting device includes an active layer formed in parallel to a (1-101) plane, it is possible to enhance the light emitting characteristic by taking an electrode plane provided on the (1-101) plane as a reflection mirror.

According to the display unit in an embodiment, there is provided a display unit according to claim 7, wherein the semiconductor light emitting device is made from a gallium nitride based semiconductor formed on a substrate by crystal growth with a (0001) plane taken as the lower end plane and (1-101) planes and planes equivalent thereto taken as the tilt planes, and the semiconductor light emitting device includes an active layer formed in parallel to the (1-101) planes and planes equivalent thereto, it is possible to concentrate light emitted from the light emission region to the lower end plane of the semiconductor light emitting device by taking electrode planes provided on the tilt planes as reflection planes, and particularly to enhance the light emission characteristic.

According to the display unit in an embodiment, since the display is configured as an image display unit or a lighting unit including an array of only one kind of the semiconductor light emitting devices allowing emission of light of a single color, or an array of a combination of a plurality of kinds of the semiconductor light emitting devices allowing emission of light of different colors, such a display unit is able to exhibit a high luminance.

According to the method of fabricating a display unit in an embodiment, since the semiconductor light emitting devices each of which has been buried in the first insulating layer and from each of which the electrodes have been extracted on the first insulating layer are fixedly arrayed on the plane of the base body at intervals and covered with the second insulating layer, and then the electrodes are extracted on the second insulating layer, it is possible to reduce the occupied area of the semiconductor light emitting devices per unit area of the display unit and simplify the wiring, and hence to significantly reduce the cost of the display unit.

According to the method of fabricating a display unit in an embodiment, since each of the semiconductor light emitting devices is buried in the first insulating layer except the upper end portion and the lower end plane thereof, and the upper end side electrode and the lower end side electrode are extracted to the upper surface of the first insulating layer, it is possible to facilitate the extraction of the upper end side electrode, and to avoid a reduction in light emission plane due to extraction of the electrode to the lower end plane side. Of course, the lower end side electrode can be extracted to the lower end plane side by using a transparent electrode or the like.

According to the method of fabricating a display unit in an embodiment, since either of both the electrodes having been extracted on the upper surface of the second insulating layer is connected to the connection electrode provided on the plane of the base body, both the electrodes are connected to drive circuits on the upper surface of the second insulating layer and on the plane of the base body, respectively, so that it is possible to avoid the drive circuits from crossing each other, and hence to simplify the wiring.

According to the method of fabricating a display unit in an embodiment, since the bare semiconductor light emitting devices are fixedly arrayed on a plane of the base body at intervals and the second insulating layer is formed so as to cover the semiconductor light emitting devices, some ingenuity is required in handling the semiconductor light emitting devices; however, the occupied area of the semiconductor light emitting devices per unit area of the display unit becomes small, and since the step of burying the semiconductor light emitting devices in the first insulating layer is omitted, it is possible to significantly reduce the cost.

According to the method of fabricating a display unit in an embodiment, since the upper end side electrode and the lower end side electrode of each of the semiconductor light emitting devices are extracted on the upper surface of the second insulating layer, and either of both the electrodes is connected to the connection electrode provided on the plane of the base body, both the electrodes are connected to drive circuits on the upper surface of the second insulating layer and on the plane of the base body, respectively, so that it is possible to avoid the drive circuits from crossing each other, and hence to simplify the wiring.

According to the display unit in an embodiment, since each of the first insulating layer and the second insulating layer is made from a polymer compound formable into a coating film, for example, a polyimide resin or an epoxy resin, it is possible to easily form the insulating layer even on the plane, having a large area, of the base body by coating, and to simplify the mounting of the semiconductor light emitting devices on the plane of the base body, and thereby reduce the cost.

According to the display unit in an embodiment, since the semiconductor light emitting device has, at a position over the light emission region, a reflection mirror from which the light is reflected downwardly, it is possible to effectively direct light from the light emission region to the lower end plane of the semiconductor light emitting device by means of the reflection mirror.

According to the method of fabricating a display unit in an embodiment, since the semiconductor light emitting device is formed into a pyramid shape or a truncated pyramid shape and any one of at least tilt planes among planes of the pyramid or truncated pyramid shaped semiconductor light emitting device is taken as the reflection mirror, it is possible to effectively direct light emitted from the light emission region to the lower end plane of the semiconductor light emitting device by means of the reflection mirror.

According to the method of fabricating a display unit in an embodiment, since the semiconductor light emitting device is made from a gallium nitride based semiconductor having a hexagonal system, and the semiconductor light emitting device includes an active layer formed in parallel to a (1-101) plane, it is possible to enhance the light emission characteristic by using an electrode plane provided on the (1-101) plane as a reflection mirror.

According to the method of fabricating a display unit in an embodiment, since the semiconductor light emitting device is made from a gallium nitride based semiconductor formed by crystal growth on a growth substrate into a hexagonal pyramid shape or a truncated hexagonal pyramid shape with a (0001) plane taken as the lower end plane and (1-101) planes taken as the tilt planes, and the semiconductor light emitting device includes an active layer formed in parallel to the (1-101) planes, it is possible to enhance the light emission characteristic by using an electrode plane provided on the (1-101) plane as a reflection mirror.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

What is claimed is:

1. A display unit comprising:
   a plurality of semiconductor light emitting devices mounted in an array on a plane of a base body, wherein the semiconductor light emitting devices are fixedly arrayed on the plane of the base body at intervals in at least one of a buried state being buried in a first insulating layer and in a bare state not being buried in the first insulating layer;
   a second insulating layer that is formed on the plane of the base body so as to cover at least a portion of the semiconductor light emitting devices; and an upper end side electrode and a lower end side of each of the semiconductor light emitting devices that are extracted via connection holes formed in specific positions associated with the first insulating layer and the second insulating layer.

2. The display unit according to claim 1, wherein the semiconductor light emitting devices are fixedly arrayed on the plane of the base body in the buried state not including upper end portions and lower end portions of the semiconductor light emitting devices, wherein the upper end side electrode and the lower end side electrode of each of the semiconductor light emitting devices are extracted to an upper surface of the first insulating layer and then extracted to an upper surface of the second insulating layer, and wherein either of the electrodes is led to a connection electrode provided on the plane of the base body.

3. The display unit according to claim 1, wherein the semiconductor light emitting devices are fixedly arrayed on the plane of the base body in the state being bared, wherein the second insulating layer is formed on the plane of the base body so as to cover the semiconductor light emitting devices, wherein the upper end side electrode and the lower end side electrode of each of the semiconductor light emitting devices are extracted to the upper surface of the second insulating layer, and wherein either of the electrodes is led to a connection electrode provided on the plane of the base body.

4. The display unit according to claim 1, wherein each of the first insulating layer and the second insulating layer includes a polymer compound formable into a coating film, the polymer compound being selected from the group consisting of a polyimide resin, an ultraviolet curing resin, an epoxy resin, and a synthetic rubber.

5. The display unit according to claim 1, wherein each of the semiconductor light emitting devices substantially emits light in a direction from a light emission region to a lower end plane, mounted on the plane of the base body, of the semiconductor light emitting device, and wherein the semiconductor light emitting devices have, at a position over the light emission region, a reflection mirror from which the light is reflected downwardly.

6. The display unit according to claim 5, wherein the semiconductor light emitting device is formed into a shape selected from the group consisting of a pyramid shape and a truncated pyramid shape, and wherein the reflection mirror is position along any one of a tilt plane associated with planes of the shaped semiconductor light emitting device.

7. The display unit according to claim 6, wherein the semiconductor light emitting device includes a gallium nitride based semiconductor having a hexagonal system, and wherein the semiconductor light emitting device includes an active layer formed in parallel to a (1-101) plane.

8. The display unit according to claim 7, wherein the semiconductor light emitting device includes a gallium nitride based semiconductor formed by crystal growth on a growth substrate into a shape selected from the group consisting of a hexagonal pyramid shape and a truncated hexagonal pyramid shape with a (0001) plane provided as the lower end plane and (1-101) provided as the tilt planes, and wherein the semiconductor light emitting device includes an active layer formed in parallel to the (1-101) planes.

9. The display unit according to claim 1, wherein the display unit is selected from the group consisting of an image display unit and a lighting unit including any one of an array of one type of the semiconductor light emitting devices allowing emission of light of a single color, and an array of a combination of a plurality of types of the semiconductor light emitting devices allowing emission of light of plurality of different colors.

10. A method of fabricating a display unit including a plurality of semiconductor light emitting devices on a plane of a base body, the method comprising the steps of:

embedding the semiconductor light emitting devices in a first insulating layer, forming specific connection holes in the first insulating layer, and extracting an upper end side electrode and a lower end side electrode of each of the semiconductor light emitting devices via the connection holes formed in the first insulating layer;

fixedly arraying semiconductor light emitting devices, from each of which the electrodes have been extracted, on the plane of the base body at intervals;

forming a second insulating layer so as to cover the semiconductor light emitting devices each of which has been embedded in the first insulating layer; and forming specific connection holes in the second insulating layer, and extracting the upper end side electrode and the lower end side electrode of each of the semiconductor light emitting devices having been extracted to the upper surface of the first insulating layer via the connection holes.

11. The method according to claim 10, wherein each of the semiconductor light emitting devices is embedded in the first insulating layer not including an upper end portion and a lower end plane thereof, and the upper end side electrode and the lower end side electrode are extracted to the upper surface of the first insulating layer.

12. The method according to claim 10, wherein the upper end side electrode and the lower end side electrode of each of the semiconductor light emitting devices having been extracted to the upper surface of the first insulating layer are both extracted to the upper surface of the second insulating layer, and wherein one of the electrodes is led to a connection electrode provided on the plane of the base body.

13. A method of fabricating a display unit including a plurality of semiconductor light emitting devices mounted in array on a plane of a base body, the method comprising the steps of:

fixedly arraying the semiconductor light emitting devices on the plane of the base body at intervals in a state being bared;

forming a second insulating layer on the plane of the base body so as to cover the semiconductor light emitting devices; and forming specific connection holes in the second insulating layer, and extracting an upper end side electrode and a lower end side electrode of each of the semiconductor light emitting devices via the connection holes.

14. The method according to claim 13, wherein the upper end side electrode and the lower end side electrode of each of the semiconductor light emitting devices in the state being bared are extracted to the upper surface of the second insulating layer; and wherein one of the electrodes is led to a connection electrode provided on the plane of the base body.

15. The method according to claim 13, wherein each of the first insulating layer and the second insulating layer includes a polymer compound formable into a coating film, the polymer compound being selected from the group consisting of a polyimide resin, an ultraviolet curing resin, an epoxy resin, and a synthetic rubber.

16. The method according to claim 13, wherein each of the semiconductor light emitting devices substantially emits light in a direction from a light emission region to the lower end plane, mounted on the plane of the base body, of the semiconductor light emitting device, and wherein the semiconductor light emitting device has, at a position over the light emission region, a reflection mirror from which the light is reflected downwardly.

17. The method according to claim 16, wherein the semiconductor light emitting device is formed into a shape selected from the group consisting of a pyramid shape and a truncated pyramid shape, and wherein at least one of tilt planes associated with planes of the shaped semiconductor light emitting device is provided as the reflection mirror.

18. The method according to claim 17, wherein the semiconductor light emitting device includes a gallium nitride based semiconductor having a hexagonal system, and wherein the semiconductor light emitting device includes an active layer formed in parallel to a (1-101) plane.

19. The method according to claim 18, wherein the semiconductor light emitting device includes a gallium nitride based semiconductor formed by crystal growth on a growth substrate into a shape selected from the group consisting of a hexagonal pyramid shape and a truncated hexagonal pyramid shape with a (0001) plane provided as the lower end plane and (1-101) planes provided as the tilt planes, and wherein the semiconductor light emitting device includes an active layer formed in parallel to the (1-101) planes.

* * * * *